(12) United States Patent
Iwamoto

(10) Patent No.: US 6,741,507 B2
(45) Date of Patent: May 25, 2004

(54) SEMICONDUCTOR DEVICE OUTPUTTING DATA AT A TIMING WITH REDUCED JITTER

(75) Inventor: Hisashi Iwamoto, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/224,343

(22) Filed: Aug. 21, 2002

(65) Prior Publication Data

US 2003/0179613 A1 Sep. 25, 2003

(30) Foreign Application Priority Data

Mar. 20, 2002 (JP) ........................................ 2002-078433

(51) Int. Cl.[7] ................................................ G11C 7/00
(52) U.S. Cl. .................... 365/194; 365/233; 365/230.06
(58) Field of Search ............................ 365/194, 230.06, 365/233, 222, 76; 327/158, 156, 161

(56) References Cited

U.S. PATENT DOCUMENTS

| | | | |
|---|---|---|---|
| 5,629,897 A | | 5/1997 | Iwamoto et al. ............ 365/195 |
| 6,088,255 A | * | 7/2000 | Matsuzaki et al. ............ 365/76 |
| 6,212,127 B1 | * | 4/2001 | Funaba et al. ............... 365/233 |
| 6,269,051 B1 | * | 7/2001 | Funaba et al. ............... 365/233 |
| 6,400,643 B1 | * | 6/2002 | Setogawa .................... 365/233 |
| 6,433,607 B2 | * | 8/2002 | Kawasaki et al. ........... 327/299 |

FOREIGN PATENT DOCUMENTS

| | | |
|---|---|---|
| JP | 11-127062 | 5/1999 |
| JP | 2000-122750 | 4/2000 |
| JP | 2001-14847 | 1/2001 |

* cited by examiner

*Primary Examiner*—Gene Auduong
(74) *Attorney, Agent, or Firm*—McDermott, Will & Emery

(57) ABSTRACT

In a DLL circuit between a phase comparator and a digital filter there is provided a signal switching portion preventing control signals UP and DOWN from being transmitted after a clock enable signal extCKE is activated and before a predetermined period of time elapses. Thus after a semiconductor device returns from a power down mode and before a predetermined period of time elapses it continues to stop updating an amount of delay of a delay line. Thus before an internal power supply potential stabilizes the delay line does not have a varying amount of delay and as a result the semiconductor device can output data at a timing free of significant fluctuation.

6 Claims, 11 Drawing Sheets

SEMICONDUCTOR DEVICE OUTPUTTING DATA AT A TIMING WITH REDUCED JITTER

BACKGROUND OF THE INVENTION

1. Field of the Invention

The present invention relates generally to semiconductor devices and particularly to synchronous semiconductor devices synchronized with an external, periodically applied clock signal to take in an external signal. More specifically, it relates to synchronous dynamic random access memory (SDRAM) having a function to reduce fluctuation in access time introduced immediately after it returns from a power down mode.

2. Description of the Background Art

Dynamic random access memory (DRAM) used as main memory has been improved to operate faster. Its operating rate, however, still cannot catch up with that of a microprocessor (MPU). It is thus often said that the DRAM access time and cycle time are a bottleneck and thus impair a system's overall performance. In recent years as a main memory for a high speed MPU there has been proposed a double data rate (DDR) SDRAM operating in synchronization with a clock signal.

For the DDR SDRAM there has been proposed a specification allowing a rapid access for example to four successive bits in synchronization with both of two clock signals (extCLK, ext/CLK) to achieve rapid access.

FIG. 7 is a diagram for illustrating a waveform of an input/output in an normal operation of a conventional DDR SDRAM.

FIG. 7 shows that the DDR SDRAM, capable of inputting and outputting data of eight bits (bite data) of data input/output terminals DQ0–DQ7, reads/writes four data (of 8×4 equal to 32 bits in total) successively. The number of bits of data read successively is referred to as a burst length and for a DDR SDRAM, typically it is variable depending on the setting of a mode register.

With reference to FIG. 7, at time t1 an external clock signal extCLK has a rising edge and external control signals (a row address strobe signal /RAS, a column address strobe signal /CAS, an address signal Add. and the like) are taken in. Since row address strobe signal /RAS has a low level of an active state, the current address signal Add. is taken in as a row address Xa. Note that address signal Add. includes address signals A0–A10 and a bank address signal BA.

At time t2 column address strobe signal /CAS attains a low level of an active state and in synchronization with clock signal extCLK going high column address strobe signal /CAS is internally taken in. The current address signal Add. is taken in as a column address Yb. In response to the row and column addresses Xa and Yb taken in, the DDR SDRAM internally effects a row and column select operation.

D/Q represents data signals DQ0–DQi input/output to/from an input/output terminal. After row address strobe signal /RAS falls to the low level when a predetermined clock cycle (3.5 clock cycles in FIG. 7) elapses or time t4 arrives, initial data q0 is output and followed by data q1–q3 output successively.

The data are output in response to clock signals extCLK and ext/CLK crossing each other. To allow data to be transferred rapidly, a data strobe signal DQS is output in phase with output data.

Note that at time t3 when clock signal extCLK has a rising edge, control signals /RAS and /WE are set low and a re-write to a memory cell (or a precharge) is effected.

At time t5 and thereafter, a write operation is represented. At time t5 a row address Xc is taken in. At time t6 when column address strobe signal /CAS and write enable signal /WE are both set to have the low level of the active state, in response to the current clock signal extCLK having a rising edge a column address Yd is taken in. Then the currently provided data d0 is taken in as initial write data. In response to row and column address strobe signal /RAS and /CAS falling, the DDR SDRAM internally effects a row and column select operation. Subsequently in synchronization with data strobe signal DQS input data d1–d3 are successively taken in and written to a corresponding memory cell.

To achieve a high data transfer rate, data is read and written in synchronization with a clock signal having a high frequency. Implementing a steady system operation with a high frequency requires a DDR SDRAM to be internally timed as defined more strictly.

To reduce fluctuation in data access time in a read, a delay locked loop (DLL) circuit is typically used. The amount of delay of the DLL circuit, however, fluctuates with noise generated in a power supply potential. Accordingly, the DLL circuit receives as an operating power supply voltage an internal power supply voltage stabilized by a regulator.

FIG. 8 is a circuit diagram for illustrating a first example of a connection of the regulator and the DLL circuit.

With reference to FIG. 8, a regulator 500 receives an external power supply voltage EXTVDD and supplies a clock input buffer 509, an inverter 507 and a DLL circuit 510 with an internal power supply potential INTVDD. Clock input buffer 509 externally receives complementary clock signals extCLK, ext/CLK and detects a point at which the clock signals cross each other. Inverter 507 receives an output from clock input buffer 509, inverts it and outputs a clock signal ECLK. DLL circuit 510 responds to clock signal ECLK by outputting an internal clock signal INTCLK (not shown). Clock signal INTCLK provides a reference timing applied to externally output data from a data output buffer.

Clock input buffer 509 includes an n channel MOS transistor 506 having a source connected to a ground node and a gate receiving a clock enable signal extCKE, an n channel MOS transistor 503 having a source connected to a drain of n channel MOS transistor 506 and a gate receiving clock signal ext/CLK, and a p channel MOS transistor 501 having a gate and drain connected to a drain of n channel MOS transistor 503 and a source receiving an internal power supply potential from regulator 500.

Clock input buffer 509 also includes an n channel MOS transistor 504 having a source connected to a drain of n channel MOS transistor 506 and a gate receiving clock signal extCLK, and a p channel MOS transistor 502 connected to a drain of n channel MOS transistor 503 and having a gate connected to a drain of n channel MOS transistor 503 and a source receiving an internal power supply potential from regulator 500.

N channel MOS transistor 504 has a drain connected to an input of inverter 507.

FIG. 9 is a circuit diagram showing a second example of the connection of the regulator and the DLL circuit.

With reference to FIG. 9, regulator 500 receives external power supply potential EXTVDD and provides internal power supply potential INTVDD to DLL circuit 510. Clock input buffer 509 and inverter 507 directly receive external power supply potential EXTVDD as an operating power supply potential.

Clock input buffer 509 is configured and clock input buffer 509, inverter 507 and DLL circuit 510 are connected, as shown in FIG. 8.

FIG. 10 is a block diagram showing a configuration of DLL circuit 510 shown in FIGS. 8 and 9.

With reference to FIG. 10, DLL circuit 510 includes a delay line 530 delaying clock signal ECLK and outputting an internal clock signal INTCLK, a delay circuit 532 delaying internal clock signal INTCLK to output a clock signal RCLK, a phase comparator 522 comparing a phase of clock signal ECLK and that of clock signal RCLK and outputting control signals UP and DOWN, a digital filter 526 receiving an output from phase comparator 522, filtering it and outputting control signals UP_D and DOWN_D, and a counter and decoder 528 driven by an output of digital filter 526 to change an internal count value to determine a delay time for delay line 530.

FIG. 11 is a circuit diagram showing a configuration of digital filter 526 shown in FIG. 10.

With reference to FIG. 11, digital filter 526 includes a shift register 52 providing an output set high when control signal UP is activated twice in pulses, an AND circuit 560 receiving an output from shift register 52 and control signal UP and outputting control signal UP_D, a shift register 54 providing an output set high when control signal DOWN is activated twice in pulses, and an AND circuit 564 receiving an output from shift register 54 and control signal DOWN and outputting control signal DOWN_D. Control signals UP_D and DOWN_D are applied to counter and decoder 528.

Data internal to shift register 52 is reset when control signal DOWN is activated in a pulse. As such, if control signal UP is activated only once and control signal DOWN is subsequently activated in a pulse, the high level is not transmitted to the output.

Furthermore, data of shift register 54 is also reset when control signal UP is activated in a pulse. Thus, if control signal DOWN is activated only once an output does not go high, and if in AND circuits 560 and 564 control signals UP and DOWN each attain the high level then the shift register's output is transmitted to counter and decoder 528. Thus, if control signal UP is not activated three times in succession, control signal UP_D is not activated. Similarly, if control signal DOWN is not activated three times in succession, control signal DOWN_D is not activated.

The regulator as shown in FIGS. 8 and 9 can generate a steady internal power supply potential if a constant electric current is consumed. For example if the value of the SDRAM's internally consumed current changes rapidly in response to an externally applied clock enable signal being activated and inactivated, however, the internal power supply potential fluctuates because of a low speed of the regulator.

When the clock enable signal is inactivated, the external clock signal is no longer internally transmitted and in the SDRAM a power down mode is set. In the power down mode, external write and read operations are stopped and the SDRAM consumes reduced power. It should be noted, however, that internal data is held for example by auto refresh.

FIG. 12 represents waveforms of an operation for illustrating a fluctuation in a power supply potential.

As shown in FIG. 12, for example at time t1 when clock enable signal extCKE transitions from high to low the SDRAM's current consumption rapidly reduces in value and internal power supply potential INTVDD accordingly, temporarily rises.

By contrast, as indicated at time t2 through t3, when clock enable signal extCKE transitions from low to high, the SDRAM starts to internally operate and its current consumption rapidly increases in value. The internal power supply voltage thus temporarily reduces.

As internal power supply potential INTVDD varies as above, the DLL circuit provides a varying amount of delay and internal clock INTCLK fluctuates and as a result a data output signal also fluctuates disadvantageously.

Furthermore the DLL circuit operation is stopped in the power down mode to reduce current consumption. Typically, an electric current with which clock input buffer 509 operates is interrupted by n channel MOS transistor 506 to stop clock signal ECLK, as shown in FIGS. 8 and 9. Thus DLL circuit 510 also stops and thus cannot follow variation in frequency of the external clock signal.

SUMMARY OF THE INVENTION

The present invention contemplates a semiconductor device free of significant fluctuation in a data output after power-down.

In summary, the present invention provides a semiconductor memory device having a normal mode and a power down mode as a mode of operation thereof and it includes a variable delay circuit and a delay time control circuit.

The variable delay circuit delays an input clock signal to output an output clock signal. The delay time control circuit compares a phase of the output clock signal and a phase of the input clock signal to apply a control signal to the variable delay circuit to indicate a delay time. The delay time control circuit suspends control of the delay time for a first prescribed period of time when the power down mode transitions to the normal mode.

Thus a main advantage of the present invention is that after a return is made from a power down mode and before the first determined period elapses, controlling an amount of delay of the delay line is continuously stopped to reduce a fluctuation in an internal clock signal that is attributed to switching modes.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
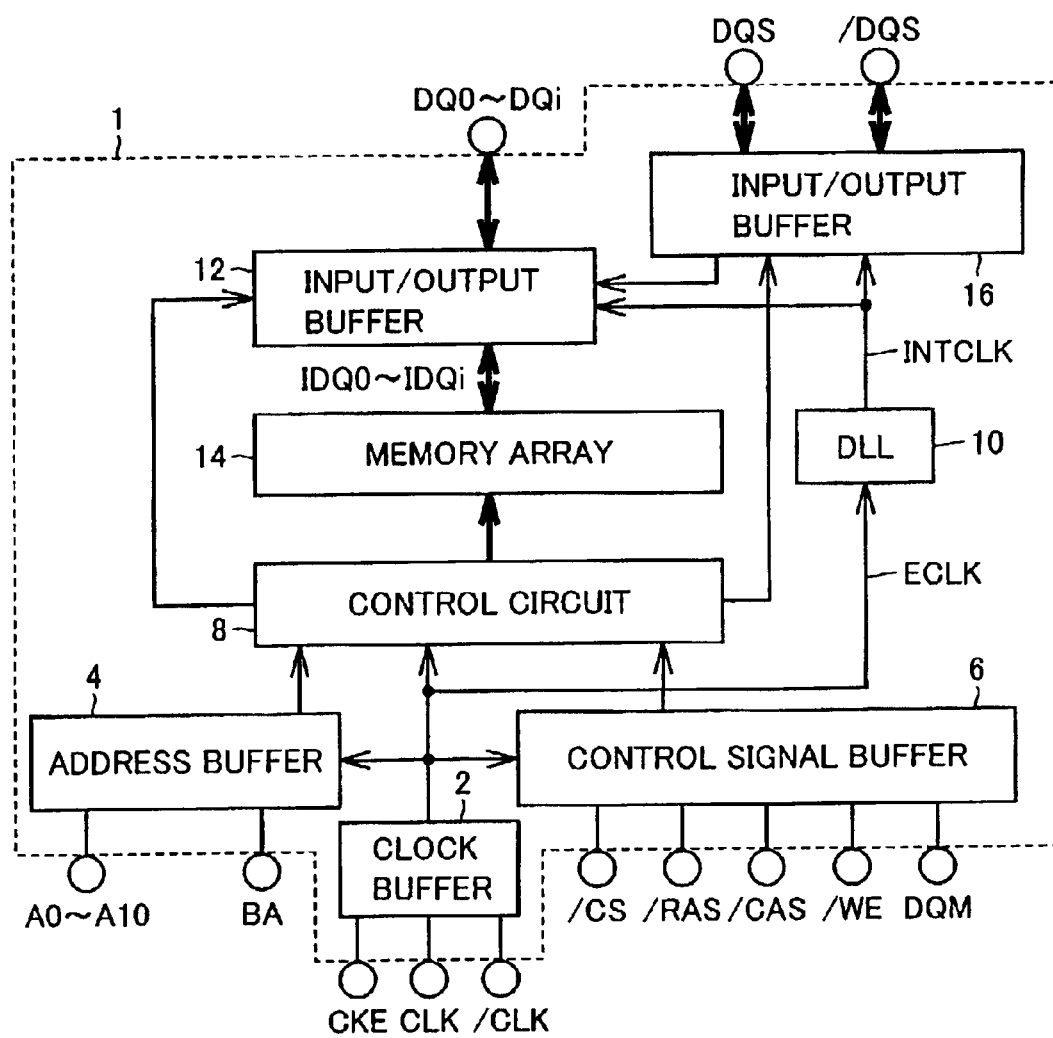
FIG. 1 is a block diagram showing a schematic configuration of a semiconductor device 1 of the present invention in a first embodiment.

Hereinafter the present invention in embodiments will more specifically be described with reference to the drawings. Note that in the figures, like reference characters denote like components.

First Embodiment

FIG. 1 is a block diagram showing a schematic configuration of a semiconductor device 1 of the present invention in a first embodiment.

FIG. 1 shows semiconductor device 1 exemplarily in the form of a double data rate, synchronous dynamic random access memory (DDR SDRAM) synchronized with a clock signal to communicate data.

Semiconductor device 1 includes a clock buffer 2 receiving external clock signals CLK and /CLK and a clock enable signal CKE, an address buffer 4 receiving address signals A0–A10 and a bank address signal BA, and a control signal buffer 6 receiving control signals /CS, /RAS, /CAS, /WE, DQM. Address buffer 4 and control signal buffer 6 are synchronized with an output received from clock buffer 2 to taken in the address signal, the control signal and the like.

Semiconductor device 1 also includes an input/output buffer 16 inputting and outputting a data strobe signals DQS, /DQS serving as a reference to time data communication, and a delay locked loop (DLL) circuit 10 generating an internal clock signal in response to an output of clock buffer 2.

As the semiconductor device internally propagates a signal with a delay, input/output buffer 12 outputting data in response to external clock signal CLK would cause data to be output at a timing delayed relative to the external clock. To prevent this, DLL circuit 10 generates from external clock CLK, /CLK internal clock signal INTCLK having a phase advanced over the external clock by a temporal period corresponding to the internal signal propagation delay.

Semiconductor device 1 also includes a control circuit 8 synchronized with an output of clock buffer 2 to receive an output of address buffer 4 and an output of control signal buffer 6, a memory array 14 controlled by control circuit 8 to communicate internal data signals IDQ0–IDQi, and an input/output buffer 12 communicating data between memory array 14 and outside.

Input/output buffer 12 is synchronized with an output of DLL circuit 10 to externally output data of the memory array. Input/output buffer 12 is also synchronized with signal DQS applied from input/output buffer 16 to take in externally input data.

Control circuit 8 includes a mode register (not shown). In response to a mode register set command provided by a combination of control signals, the mode register holds a mode of operation designated by the currently provided address signal.

Figure 2:
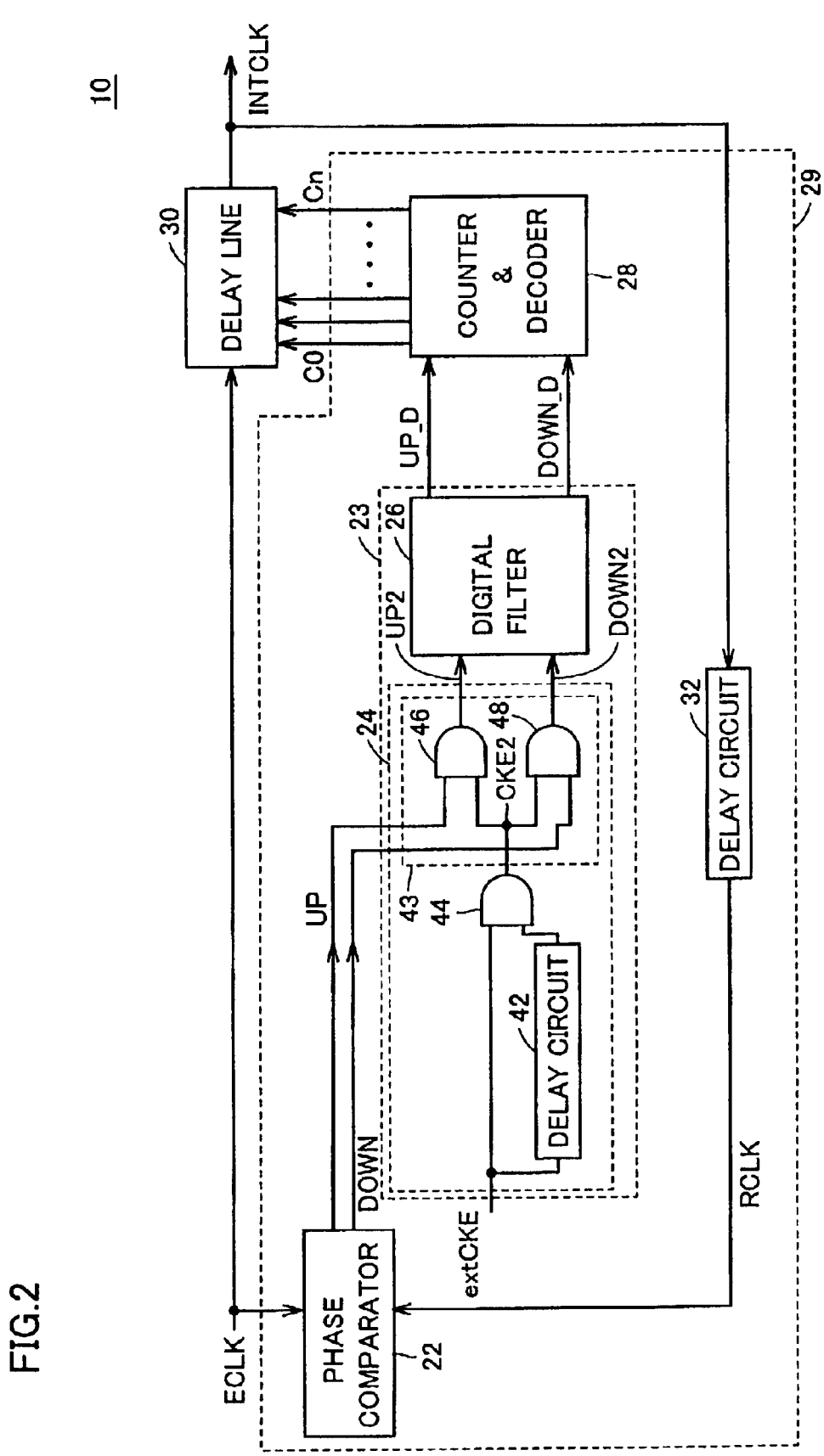
FIG. 2 is a circuit diagram showing a configuration of a DLL circuit 10 shown in FIG. 1.

FIG. 2 is a circuit diagram showing a configuration of DLL circuit 10 shown in FIG. 1.

As shown in FIG. 2, DLL circuit 10 includes a delay line 30 receiving and delaying a clock signal ECLK to output an internal clock signal INTCLK, and a delay time control circuit 29 comparing a phase of internal clock signal INTCLK and a phase of clock signal ECLK to apply a control signal to delay line 30 to indicate a delay time.

Clock signal ECLK is a clock signal output from the FIG. 1 clock buffer 2 which receives external clock signals CLK and /CLK.

Delay time control circuit 29 includes a delay circuit 32 receiving and delaying internal clock signal INTCLK to output a clock signal RCLK, a phase comparator 22 comparing phases of clock signals ECLK and RCLK to output control signals UP and DOWN, a transmission portion 23 responsive to a clock enable signal extCKE being activated to receive control signals UP and DOWN and transmit control signals UP and DOWN as control signals UP_D and DOWN_D, and a counter and decoder 28 responsive to control signals UP_D and DOWN_D to output control signals C0–Cn to delay line 30.

Transmission portion 23 includes a signal switching portion 24 and a digital filter 26. After clock enable signal extCKE is activated when a predetermined period of time elapses transmission portion 23 transmits an output received from phase comparator 22. Digital filter 26 filters an output received from signal switching portion 24. Note that digital filter 26 is configurable for example by a circuit similar to a filtering portion 51 described hereinafter with reference to FIG. 4.

Signal switching portion 24 includes a delay circuit 42 receiving clock enable signal extCKE, an AND circuit 44 receiving clock enable signal extCKE and an output from delay circuit 42 and outputting a signal CKE2, and a gate circuit 43 preventing control signals UP and DOWN from passing only for a predetermined period following clock enable signal extCKE being activated in response to an output from AND circuit 44.

Gate circuit 43 includes an AND circuit 46 receiving an output from AND circuit 44 and control signal UP and outputting a signal UP2, and an AND circuit 48 receiving an output from AND circuit 44 and control signal DOWN and outputting a signal DOWN2.

DLL circuit 10 of FIG. 2 operates, as will now be described hereinafter briefly.

Phase comparator 22 compares a phase of clock signal ECLK and that of clock signal RCLK. Clock signal ECLK is output by clock buffer 2 receiving externally applied clock signals CLK and /CLK. Clock signal RCLK is generated from internal clock signal INTCLK output from DLL circuit 10 that is delayed by delay circuit 32 by a temporal period corresponding to a propagation delay introduced before input/output buffer 12.

Control signals UP and DOWN are generated by phase comparator 22 to eliminate the difference in phase between dock signals ECLK and RCLK. This control signal is counted by counter and decoder 28. In response to the counted value, control signals C0–Cn are output to control a delay time of the delay line to adjust an amount of delay of delay line 30.

Figure 3:
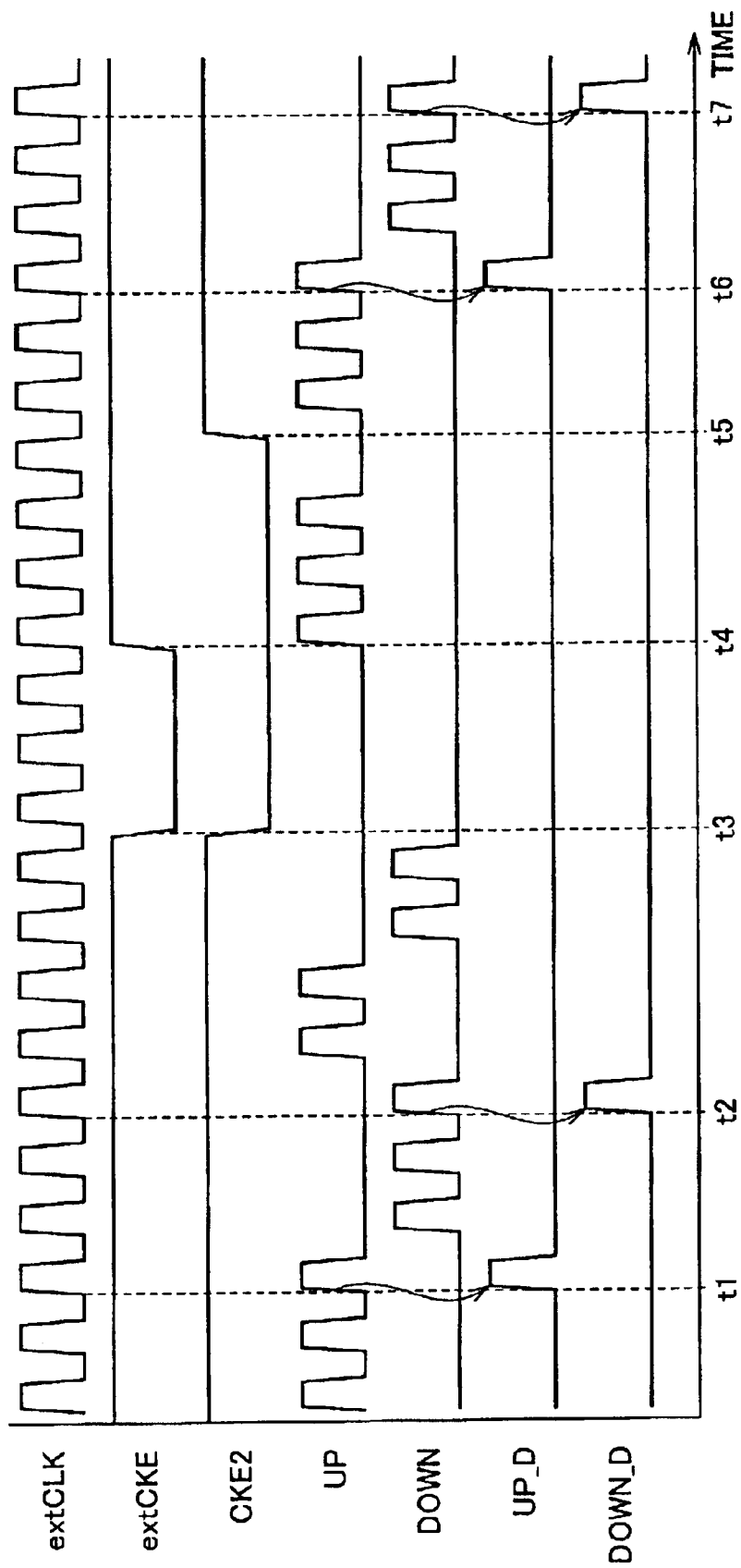
FIG. 3 represents a waveform of an operation for illustrating an operation of DLL circuit 10.

FIG. 3 represents a waveform of an operation for illustrating an operation of DLL circuit 10.

With reference to FIGS. 2 and 3, up to time t3 transmission portion 23 normally operates. More specifically, at time t1 control signal UP is input three times in succession and control signal UP_D is responsively output.

Similarly, at time t2 control signal DOWN is input three times in succession and control signal DOWN_D is responsively output. At time t2 through t3 control signals UP and DOWN are both activated only twice in succession and control signals UP_D and DOWN_D are thus not output. Thus during that time the delay line does not have an amount of delay updated.

In such a normal mode of operation as described above, signal switching portion 24 transmits control signals UP and DOWN to digital filter 26. In digital filter 26 the phase comparator 22 output is thinned out in order to prevent delay line 30 from having an amount of delay with a variation chattering and reduce overall current consumption.

Subsequently at time t3 through t4 clock enable signal extCKE is set low and the power down mode is set.

At time t4 clock enable signal extCKE transitions from low to high or is activated and the SDRAM returns from the power down mode to the normal mode of operation.

Figure 12:
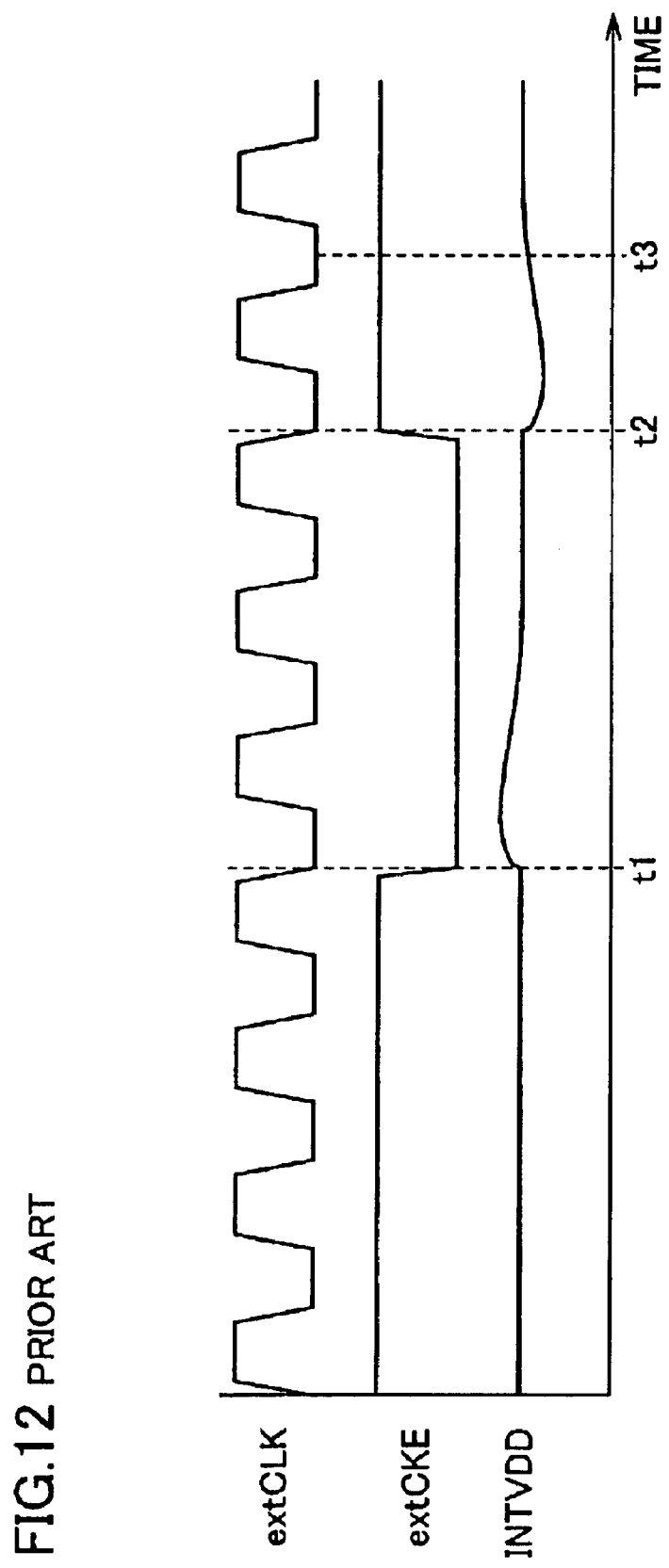
FIG. 12 represents a waveform of an operation for illustrating a variation in a power supply potential.

At time t4 through t5 or immediately after the SDRAM returns from the power down mode an internal power supply potential for the DLL circuit is unstable, as shown in FIG. 12. If at that time the phase comparison is effected and the delay line has an amount of delay updated then despite the unstable internal power supply potential phase comparator 22 operates to eliminate the difference in phase between clock signals ECLK and RCLK. As such, when a determined period of time further elapses and the internal power supply potential stabilizes, delay line 30 needs to again have an amount of delay updated. Thus after the power down mode the DLL circuit 10 output fluctuates disadvantageously.

To overcome this disadvantage, signal switching portion 24 of FIG. 2 operates in response to clock enable signal extCLK going from low to high to stop activating control signals UP2 and DOWN2 for a determined period of time and thus prevent delay line 30 from having an updated amount of delay. After clock enable signal extCKE has transitioned from low to high when the determined period of time elapses and the internal power supply voltage has stabilized, a phase comparison result is transmitted to digital filter 26 to start updating an amount of delay of delay line 30 to reduce fluctuation of internal clock signal INTCLK. The SDRAM can thus output data free of disadvantageous fluctuation.

At time t5 and thereafter, control signals UP2 and DOWN2 are no longer inactivated and a normal operation similar to that effected before time t3 is effected.

As has been described above, the semiconductor device of the first embodiment after it returns from the power down mode between first and second periods changes a frequency of updating an amount of delay of the delay line. In particular, for the first period it prevents transmission of an output of the phase comparator to prevent the delay line from having an amount of delay updated when a voltage varies. Thus after an internal power supply voltage has stabilized a lock operation starts and an internal clock signal can thus be free of significant fluctuation.

Second Embodiment

As has been described in the first embodiment, a typical DLL circuit inputs a result of a phase comparator to a digital filter, rather than exactly reflecting it in a delay line.

If it is desired that a phase is locked upon power-on as soon as possible, data is not filtered and but passed through or a reduced filtering effect is adopted to provide an increased frequency of updating a delay time of the delay line.

Thereafter when a clock is locked the frequency of updating a delay time of the delay line by means of the digital filter is reduced to reduce chattering and consider current consumption.

In some of systems using an SDRAM, however, an external clock itself varies in frequency before and after a power down operation. This phenomenon is caused for example because the power down operation results in a variation in the temperature of the entirety of the system. The DLL circuit in such a case cannot immediately follow variation in frequency and access time would thus fluctuate.

To overcome such a disadvantage, after the SDRAM returns from the power down mode until it has a steady internal power supply potential it may temporally stop controlling updating a delay time of the delay line and thereafter for a determined period of time it may frequently updates a delay time of the delay line and thereafter allow a normal operation.

Figure 4:
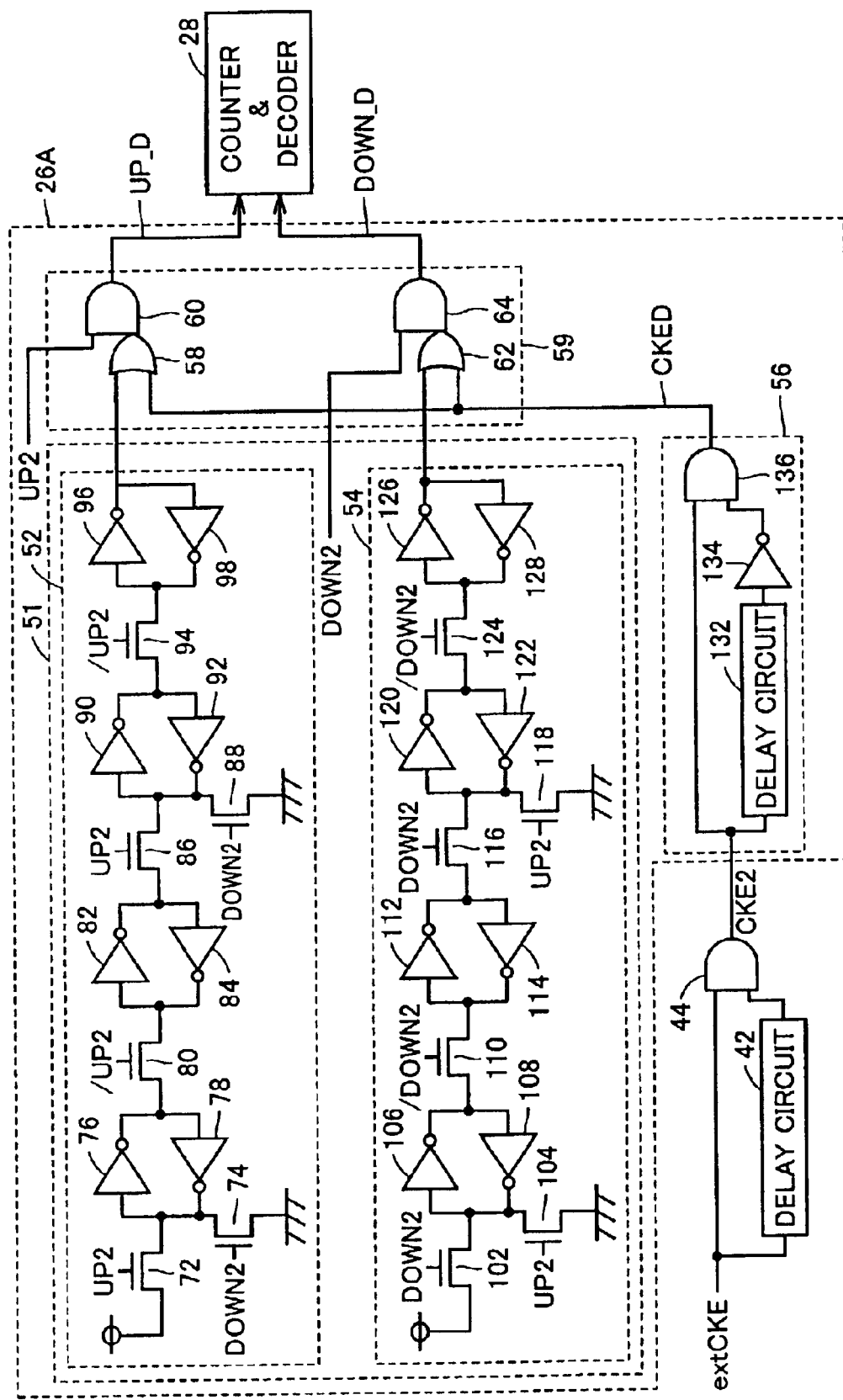
FIG. 4 is a circuit diagram showing a configuration of a digital filter 26A used in a second embodiment.

FIG. 4 is a circuit diagram showing a configuration of a digital filter 26A used in the second embodiment.

As shown in FIG. 4, digital filter 26A includes a filtering portion 51 effecting a filtering operation determining from a frequency of each of control signals UP2, DOWN2 input in succession whether to provide transmission, a pulse generation circuit 56 outputting a pulsed signal CKED activated for a predetermined period of time in response to signal CKE2, output from the FIG. 2 AND circuit 44, being activated, and a gate circuit 59 determining from an output of pulse generation circuit 56 whether to exactly pass control signals UP2, DOWN2 through or pass those signals filtered by filtering portion 51.

Filtering portion 51 includes shift registers 52 and 54. When control signal UP2 is activated shift register 52 responsively shifts a high level and when control signal DOWN 2 is activated shift register 52 resets transmitted high level data to see how many successive times control signal UP2 is input. When control signal DOWN2 is activated shift register 54 responsively shifts a high level and when control signal UP2 is activated shift register 54 responsively resets transmitted high level data to see how many successive times control signal DOWN2 is input.

Shift register 52 includes an n channel MOS transistor 72 having one end coupled with a power supply node and a gate receiving control signal UP2, an n channel MOS transistor 74 connected between the other end of n channel MOS transistor 72 and a ground node and having a gate receiving control signal DOWN2, an inverter 76 having an input connected to the other end of n channel MOS transistor 72, and an inverter 78 receiving an output from inverter 76, inverting it and feeding it back to an input of inverter 76.

Shift register 52 also includes an n channel MOS transistor 80 having one end connected to an output of inverter 76 and a gate receiving a signal /UP2, an inverted version of control signal UP2, an inverter 82 having an input connected to the other end of n channel MOS transistor 80, and an inverter 84 receiving an output from inverter 82, inverting it and feeding it back to an input of inverter 82.

Shift register 52 also includes an n channel MOS transistor 86 having one end coupled with an output of inverter 82 and a gate receiving control signal UP2, an n channel MOS transistor 88 connected between the other end of n channel MOS transistor 86 and a ground node and having a gate receiving control signal DOWN2, an inverter 90 having an input connected to the other end of n channel MOS transistor 86, and an inverter 92 receiving an output from inverter 90, inverting it and feeding it back to an input of inverter 90.

Shift register 52 also includes an n channel MOS transistor 94 having one end connected to an output of inverter 90 and a gate receiving signal /UP2, an inverter 96 having an input connected to the other end of n channel MOS transistor 94, and an inverter 98 receiving an output from inverter 96, inverting it and feeding it back to an input of inverter 96.

Shift register 54 includes an n channel MOS transistor 102 having one end coupled with a power supply node and a gate receiving control signal DOWN2, an n channel MOS transistor 104 connected between the other end of n channel MOS transistor 102 and a ground node and having a gate receiving control signal UP2, an inverter 106 having an input connected to the other end of n channel MOS transistor 102, and an inverter 108 receiving an output from inverter 106, inverting it and feeding it back to an input of inverter 106.

Shift register 54 also includes an n channel MOS transistor 110 having one end connected to an output of inverter 106 and a gate receiving a signal /DOWN2, an inverted version of control signal DOWN2, an inverter 112 having an input connected to the other end of n channel MOS transistor 110, and an inverter 114 receiving an output from inverter 112, inverting it and feeding it back to an input of inverter 112.

Shift register 54 also includes an n channel MOS transistor 116 having one end coupled with an output of inverter 112 and a gate receiving control signal DOWN2, an n channel MOS transistor 118 connected between the other end of n channel MOS transistor 116 and a ground node and having a gate receiving control signal UP2, an inverter 120 having an input connected to the other end of n channel MOS transistor 116, and an inverter 122 receiving an output from inverter 120, inverting it and feeding it back to an input of inverter 120.

Shift register 54 also includes an n channel MOS transistor 124 having one end connected to an output of inverter 120 and a gate receiving signal /DOWN2, an inverter 126 having an input connected to the other end of n channel MOS transistor 124, and an inverter 128 receiving an output from inverter 126, inverting it and feeding it back to an input of inverter 126.

Pulse generation circuit 56 includes a delay circuit 132 delaying clock enable signal extCKE, an inverter 134 receiving an output from delay circuit 132 and inverting it, and an AND circuit 136 receiving an output from inverter 134 and clock enable signal extCKE and outputting a pulsed signal CKED.

Gate circuit 59 includes an OR circuit 58 receiving an output from inverter 96 and an output from AND circuit 136, and an AND circuit 60 receiving an output from OR circuit 58 and control signal UP2 and outputting control signal UP_D.

Gate circuit 59 also includes an OR circuit 62 receiving an output from AND circuit 136 and an output from inverter 126, and an AND circuit 64 receiving an output from OR circuit 62 and control signal DOWN2 and outputting control signal DOWN_D.

Note that in the second embodiment the present invention in operation provides the same waveform as in a variation thereof, or a third embodiment, as will later be described correctively in the third embodiment.

In the second embodiment, after the semiconductor device returns from the power down mode and before a first period of time elapses, the semiconductor device prevents transmission of a result of a phase comparison. Subsequently for a second period of time, the result is passed through a digital filter to frequently update an amount of delay of a delay line. Then, an internal clock is generated in quick response to an external clock before temperature or the like stabilizes in a steady state. Subsequently for a third period of time the digital filter provides a filtering effect to limit a frequency of updating an amount of delay of the delay line and thus prevents the internal clock from having a phase chattering.

Third Embodiment

Another exemplary configuration capable of controlling similar to that provided in the second embodiment, will be described.

Figure 5:
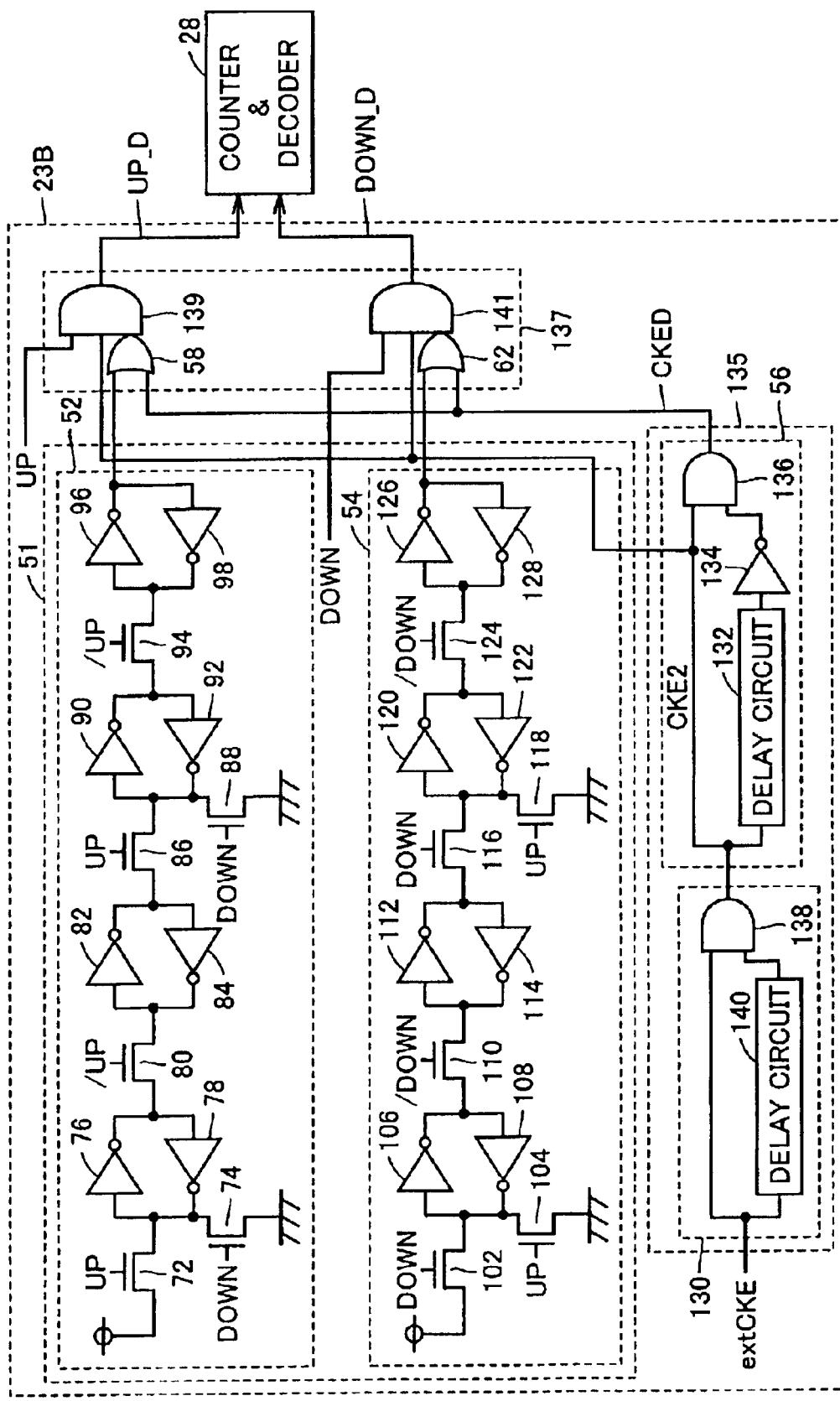
FIG. 5 is a circuit diagram showing a configuration of a transmission portion 23B used in a third embodiment.

FIG. 5 is a circuit diagram showing a configuration of a transmission portion 23b used in the third embodiment.

As shown in FIG. 5, transmission portion 23B includes a filtering portion 51 providing a filtering operation depending on how many times control signals UP, DOWN are each input successively, a control signal generation portion 135 outputting control signal CKE2 and pulsed signal CKED in response to clock enable signal extCKE, and a gate circuit 137 responsive to an output of control signal generation portion 135 to select passing control signals UP and DOWN, outputting a result of a filtering operation effected by filtering portion 51, or preventing control signals UP and DOWN from passing therethrough.

Filtering portion 51 of FIG. 5 is different from that of FIG. 4 in that control signals UP2, DOWN2 are replaced by control signals UP, DOWN. Except that, it is similar in configuration to that described with reference to FIG. 4.

Control signal generation portion 135 includes a rise delay circuit 130 delaying a rising edge of clock enable signal extCKE, and a pulse generation circuit 56 receiving signal CKE2 from rise delay circuit 136 and outputting pulsed signal CKED of a predetermined period. Rise delay circuit 130 includes a delay circuit 140 receiving and delaying clock enable signal extCKE, and an AND circuit 138 receiving an output from delay circuit 140 and clock enable signal extCKE and outputting signal CKE2.

Pulse generation circuit 56 is similar in configuration to that described with reference to FIG. 4.

Gate circuit 137 has the configuration of gate circuit 59 described with reference to FIG. 4, although AND circuit 60 is replaced by a 3-input AND circuit 139 receiving control signals UP and CKE2 and an output from OR circuit 58 and outputting control signal UP_D and AND circuit 64 is replaced by a 3-input AND circuit 141 receiving control signals DOWN and CKED and an output from OR circuit 62 and outputting control signal DOWN_D.

Figure 6:
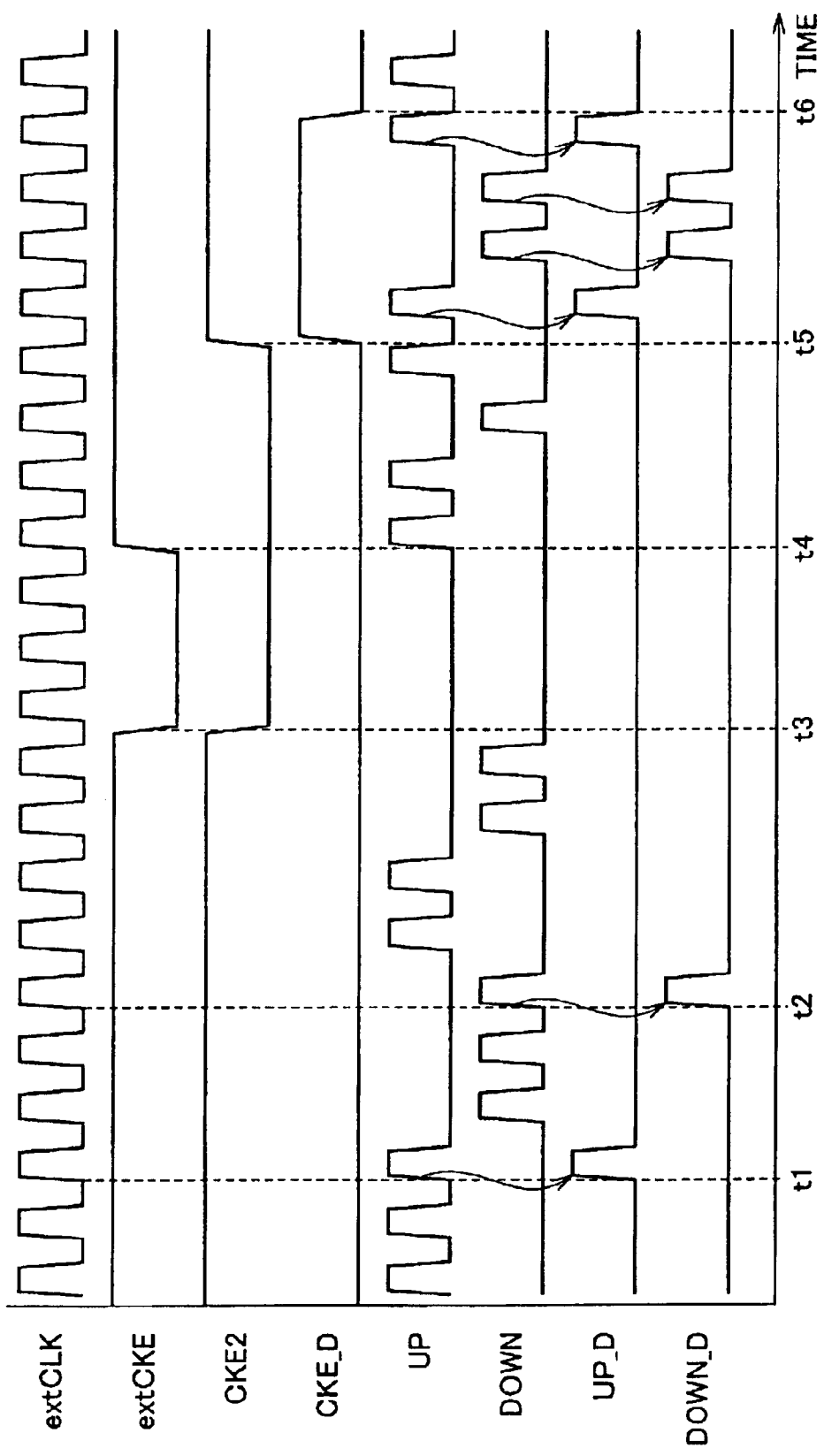
FIG. 6 represents a waveform of an operation for illustrating an operation of the FIG. 5 transmission portion 23B.
Figure 7:
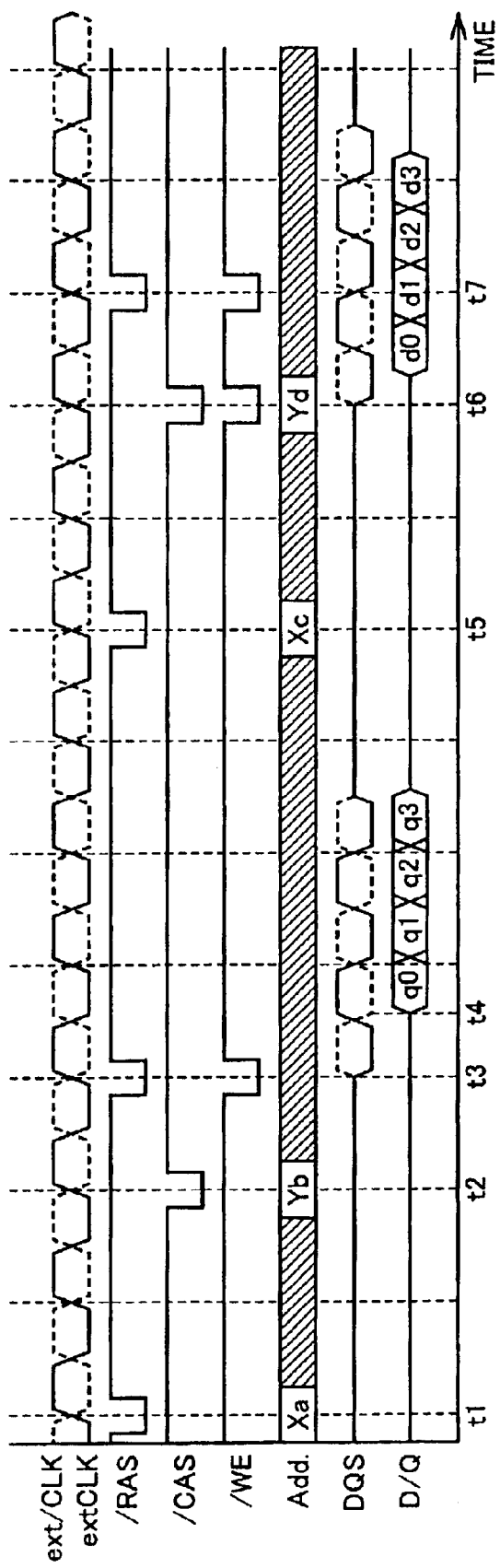
FIG. 7 represents a waveform of an operation for illustrating an input/output of a typical operation of a conventional DDR SDRAM.
Figure 8:
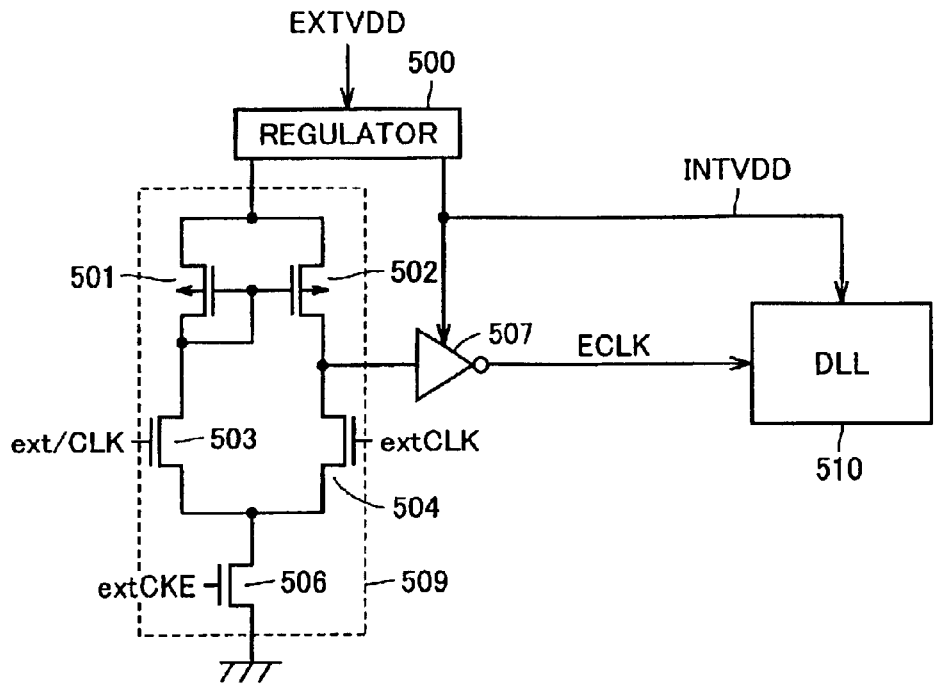
FIG. 8 is a circuit diagram for illustrating a first example of a connection of a regulator and a DLL circuit.
Figure 9:
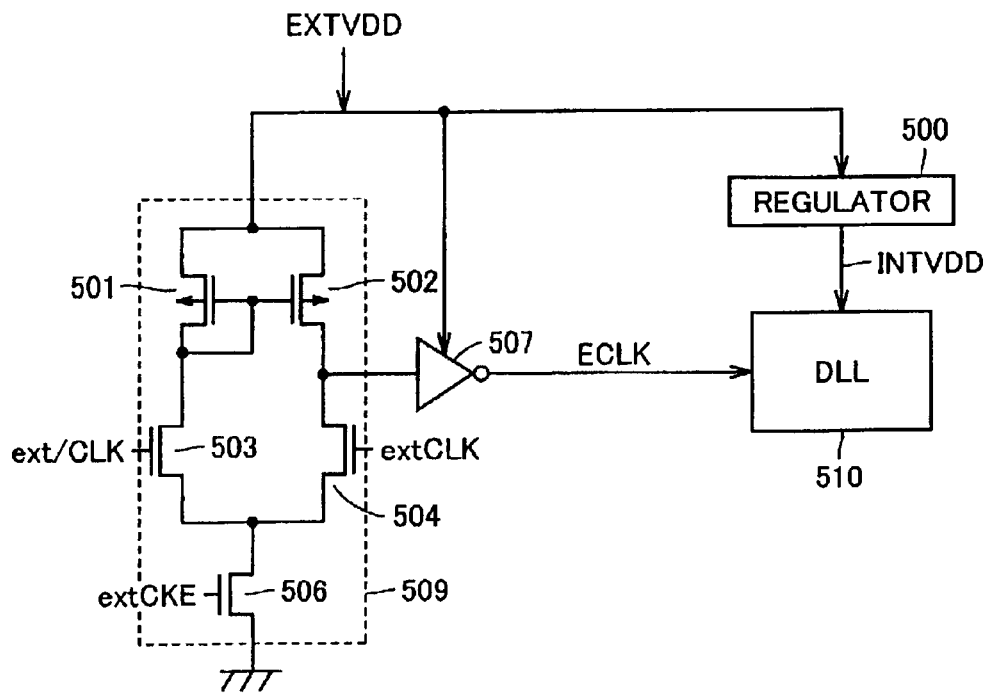
FIG. 9 is a circuit diagram showing a second example of the connection of the regulator and the DLL circuit.
Figure 10:
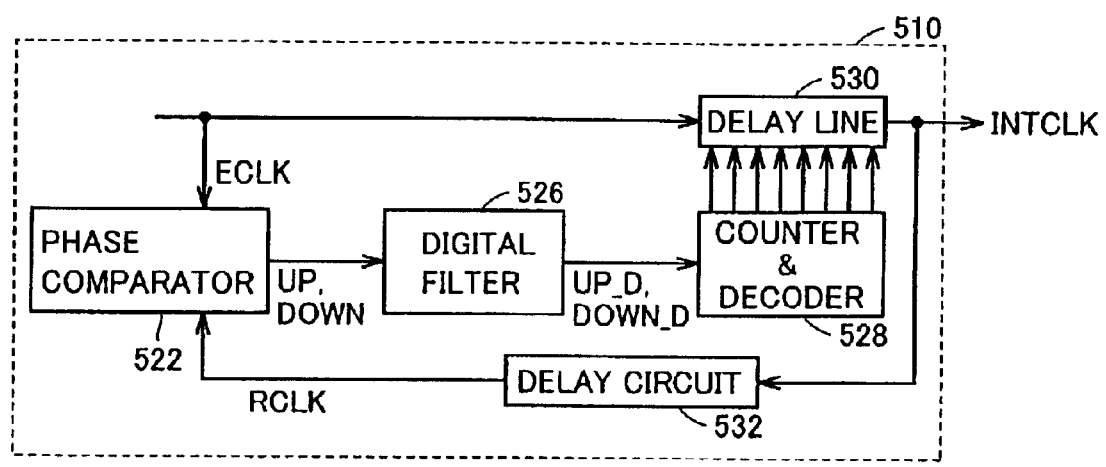
FIG. 10 is a block diagram showing a configuration of DLL circuit 510 of FIGS. 8 and 9.
Figure 11:
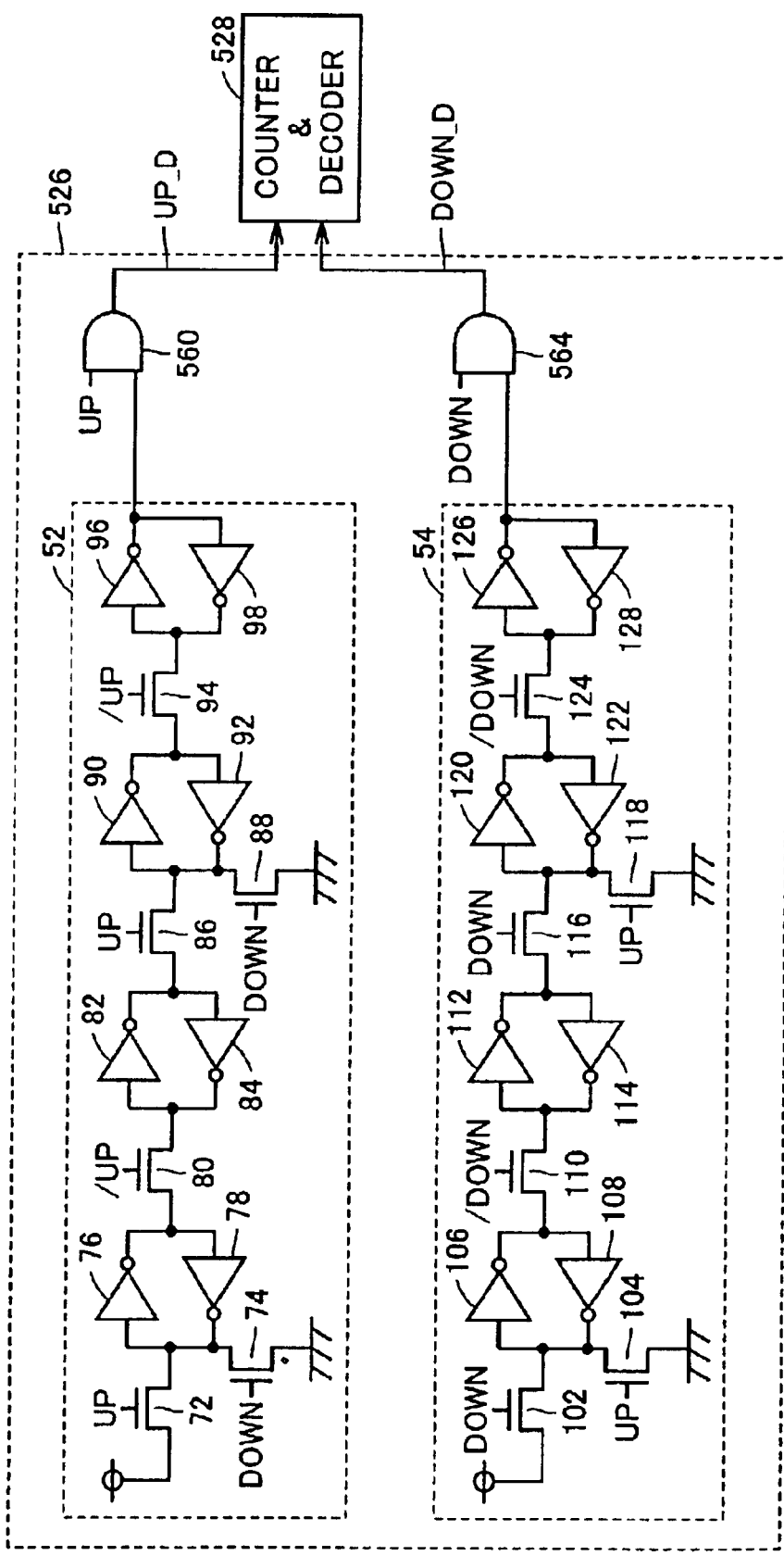
FIG. 11 is a circuit diagram showing a configuration of a digital filter 526 shown in FIG. 10.

FIG. 6 represents a waveform of an operation for illustrating an operation of transmission portion 23B shown in FIG. 5.

With reference to FIGS. 5 and 6, up to time t3 a normal operation is effected, which is similar to that described with reference to FIG. 4.

At time t3 through t4 clock enable signal extCKE set low and the power down mode is set in the SDRAM.

At time t4 clock enable signal extCKE is driven from low to high and the power down mode is responsively reset. At time t4 through t5 signal CKE2 has the low level and AND circuits 139, 141 thus act to fix both control signals UP_D and DOWN_D low.

At time t5 signal CKE goes from low to high and pulsed signal CKED is simultaneously activated. In response, after time t5 for a temporal period determined by a delay time of the FIG. 5 delay circuit 132, OR circuits 58 and 62 and AND circuits 139 and 141 act to output control signals UP and DOWN as UP_D and DOWN_D through gate circuit 137.

More specifically, during this determined period of time, pulsed signal CKED is activated for a determined period of time and during that period, without undergoing a filtering operation an amount delay of the delay line is updated frequently. This allows a rapid catching up with variation of an external frequency and can thus reduce fluctuation of access time.

At time t6 when pulsed signal CKED is set low or inactivated the device operates normally and transmission portion 23B allows filtering portion 51 to effect a filtering operation and operates, as it does before time t3.

As has been described above, in the third embodiment after the semiconductor device returns from a power down mode and before a first period of time subsequently elapses and a power supply potential stabilizes the device stops updating an amount of delay of a delay line. Subsequently for a second period of time before the temperature of the system is stabilized, the device frequently updates the delay line to provide an enhanced ability of an internal clock to follow an external clock. The system after the second period of time has elapsed obtains a steady state and an effect of the digital filter is utilized to reduce current consumption and also reduce chattering to provide an optimal operation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having a normal mode and a power down mode as operation modes, comprising:
    a variable delay circuit delaying an input clock signal to output an output clock signal; and
    a delay time control circuit comparing a phase of said output clock signal and a phase of said input clock signal to apply a control signal to said variable delay circuit to indicate a delay time, said delay time control circuit suspending control of said delay time for a first prescribed period of time when said power down mode transitions to said normal mode.

2. The semiconductor device according to claim 1, wherein said delay time control circuit includes
    a phase comparison circuit comparing the phase of said input clock signal and the phase of said output clock signal,
    a transmission portion setting an output of said phase comparison circuit to have an inactive state for said first prescribed period of time, and
    a control signal output portion changing said control signal in response to an output of said transmission portion.

3. The semiconductor device according to claim 2, wherein said transmission portion includes
    a signal switching portion having a delay circuit receiving a switch signal indicating a switching of said operation modes, and preventing said output of said phase comparison circuit from passing for said first prescribed period of time in response to said switch signal and an output of said delay circuit, and
    a filtering portion receiving a phase comparison result of said phase comparison circuit through said signal switching portion and transmitting said phase comparison result when an equal result is obtained a predetermined number of times as said phase comparison result.

4. The semiconductor device according to claim 3, wherein said transmission portion further includes a first gate circuit receiving an output from said filtering portion and an output from said signal switching portion, transmitting said output from said signal switching portion for a second prescribed period subsequent to said first prescribed period, and transmitting said output from said filtering portion after said second prescribed period of time elapses, and
    said control signal output portion has a counter counting an output of said transmission portion.

5. The semiconductor device according to claim 2, wherein said transmission portion includes
    a control signal generation portion outputting a transition control signal indicating a first time of transition from said first prescribed period to a second prescribed period subsequent to said first prescribed period and a second time of transition from said second prescribed period of time to a third period subsequent to said second prescribed period in response to a switch signal indicating a switching of said operation modes,
    a filtering portion determining whether to transmit said output of said phase comparison circuit in response to a number of times said output of said phase comparison circuit is successively input, and
    a second gate circuit, in response to said transition control signal, selecting and outputting one of a fixed signal indicative of an inactive state, said output of said phase comparison circuit, and said output of said filtering portion.

6. The semiconductor device according to claim 5, further comprising:
    a memory array communicating data in response to said input clock signal; and
    an output buffer receiving said data from said memory array and synchronized with said output clock signal to externally output data.

* * * * *